United States Patent
Enicks

(10) Patent No.: US 7,439,558 B2
(45) Date of Patent: Oct. 21, 2008

(54) METHOD AND SYSTEM FOR CONTROLLED OXYGEN INCORPORATION IN COMPOUND SEMICONDUCTOR FILMS FOR DEVICE PERFORMANCE ENHANCEMENT

(75) Inventor: Darwin Gene Enicks, Colorado Springs, CO (US)

(73) Assignee: Atmel Corporation, San Jose, CA (US)

(*) Notice: Subject to any disclaimer, the term of this patent is extended or adjusted under 35 U.S.C. 154(b) by 122 days.

(21) Appl. No.: 11/267,473

(22) Filed: Nov. 4, 2005

(65) Prior Publication Data

US 2007/0102728 A1  May 10, 2007

(51) Int. Cl.
H01L 23/62 (2006.01)

(52) U.S. Cl. ............... 257/197; 257/378; 257/462; 257/518; 257/E21.375

(58) Field of Classification Search ............ 257/47, 257/187, 197, 198, 205, 273, 350, 361, 370, 257/378, 423, 462, 477–479, 511, 512, 517, 257/518, 525, 526, 539–543, 552–593; 438/309, 438/48, 235, 312
See application file for complete search history.

(56) References Cited

U.S. PATENT DOCUMENTS

| | | | |
|---|---|---|---|
| 3,888,518 A | 6/1975 | Delessert | |
| 4,352,532 A | 10/1982 | Hardin | |
| 4,383,547 A | 5/1983 | Lorenz et al. | |
| 4,437,479 A | 3/1984 | Bardina et al. | |
| 4,771,326 A * | 9/1988 | Curran | 257/18 |
| 4,852,516 A | 8/1989 | Rubin et al. | |
| 5,001,534 A | 3/1991 | Lunardi et al. | |
| 5,006,912 A | 4/1991 | Smith et al. | |
| 5,137,047 A | 8/1992 | George | |
| 5,247,192 A | 9/1993 | Nii | |
| 5,316,171 A | 5/1994 | Danner, Jr. et al. | |
| 5,316,958 A | 5/1994 | Meyerson | |
| 5,329,145 A | 7/1994 | Nakagawa | |

(Continued)

FOREIGN PATENT DOCUMENTS

WO   WO-07/056030 A2   5/2007

OTHER PUBLICATIONS

Phil Danielson, "Desorbing Water in Vacuum Systems: Bakeout or UV?", A Journal of Practical and Useful Vacuum Technology, Jan. 2001, Available at: http://www.vacuumlab.com/Articles/VacLab22%20.pdf (Visited: Jul. 14, 2005).

(Continued)

Primary Examiner—A. Sefer
Assistant Examiner—Scott R Wilson
(74) Attorney, Agent, or Firm—Schwegman, Lundberg & Woessner P.A.

(57) ABSTRACT

A method and system for providing a bipolar transistor is described. The method and system include providing a compound base region, providing an emitter region coupled with the compound base region, and providing a collector region coupled with the compound base region. The bipolar transistor may also include at least one other predetermined portion. The method and system also include providing at least one predetermined amount of oxygen to at least one of the compound base region, the emitter region, the collector region, and the predetermined portion of the bipolar transistor.

18 Claims, 4 Drawing Sheets

U.S. PATENT DOCUMENTS

| | | | |
|---|---|---|---|
| 5,331,186 | A | 7/1994 | Morizuka |
| 5,352,912 | A | 10/1994 | Crabbe et al. |
| 5,412,233 | A | 5/1995 | Dubon-Chevallier et al. |
| 5,426,316 | A | 6/1995 | Mohammad |
| 5,440,152 | A | 8/1995 | Yamazaki |
| 5,449,294 | A | 9/1995 | Rench et al. |
| 5,453,124 | A | 9/1995 | Moslehi et al. |
| 5,494,836 | A | 2/1996 | Imai |
| 5,506,427 | A | 4/1996 | Imai |
| 5,523,243 | A | 6/1996 | Mohammad |
| 5,583,059 | A | 12/1996 | Burghartz |
| 5,656,514 | A | 8/1997 | Ahlgren |
| 5,665,614 | A | 9/1997 | Hafizi |
| 5,668,388 | A | 9/1997 | Delage et al. |
| 5,729,033 | A | 3/1998 | Hafizi |
| 5,798,277 | A | 8/1998 | Ryum et al. |
| 5,821,149 | A | 10/1998 | Schuppen et al. |
| 5,881,476 | A | 3/1999 | Strobush et al. |
| 5,912,481 | A | 6/1999 | El-Sharawy et al. |
| 5,962,880 | A | 10/1999 | Oda et al. |
| 5,972,783 | A | 10/1999 | Arai et al. |
| 5,992,463 | A | 11/1999 | Redemann et al. |
| 6,074,698 | A | 6/2000 | Sakurai et al. |
| 6,099,599 | A | 8/2000 | Wu |
| 6,171,920 | B1 | 1/2001 | El-Sharawy et al. |
| 6,199,255 | B1 | 3/2001 | Wang et al. |
| 6,251,738 | B1 | 6/2001 | Huang |
| 6,325,886 | B1 | 12/2001 | Harris et al. |
| 6,349,744 | B1 | 2/2002 | Grosshart |
| 6,352,591 | B1 | 3/2002 | Yieh et al. |
| 6,410,396 | B1 | 6/2002 | Casady et al. |
| 6,417,059 | B2 | 7/2002 | Huang |
| 6,423,990 | B1 | 7/2002 | El-Sharawy et al. |
| 6,442,867 | B2 | 9/2002 | Pressnall et al. |
| 6,459,104 | B1 | 10/2002 | Schuegraf |
| 6,509,242 | B2 | 1/2003 | Frei et al. |
| 6,531,369 | B1 | 3/2003 | Ozkan et al. |
| 6,541,346 | B2 | 4/2003 | Malik |
| 6,555,874 | B1 | 4/2003 | Hsu et al. |
| 6,563,145 | B1 | 5/2003 | Chang et al. |
| 6,573,539 | B2 | 6/2003 | Huang |
| 6,598,279 | B1 | 7/2003 | Morgan |
| 6,607,605 | B2 | 8/2003 | Tan |
| 6,667,489 | B2 | 12/2003 | Suzumura et al. |
| 6,670,654 | B2 | 12/2003 | Lanzerotti et al. |
| 6,696,710 | B2 | 2/2004 | Moll et al. |
| 6,756,615 | B2 | 6/2004 | Yoshioka et al. |
| 6,759,697 | B2 | 7/2004 | Toyoda et al. |
| 6,764,918 | B2 | 7/2004 | Loechelt |
| 6,794,237 | B2 | 9/2004 | Babcock et al. |
| 6,797,578 | B1 | 9/2004 | U'ren |
| 6,806,513 | B2 | 10/2004 | Chau et al. |
| 6,861,323 | B2 | 3/2005 | Shideler |
| 6,861,324 | B2 | 3/2005 | Kalnitsky et al. |
| 6,870,204 | B2 | 3/2005 | Torvik et al. |
| 7,183,576 | B2 * | 2/2007 | Chu et al. ............... 257/77 |
| 2002/0117657 | A1 | 8/2002 | Moll et al. |
| 2002/0135761 | A1 | 9/2002 | Powell et al. |
| 2002/0149033 | A1 | 10/2002 | Wojtowicz |
| 2002/0155670 | A1 | 10/2002 | Malik |
| 2003/0022528 | A1 | 1/2003 | Todd |
| 2003/0122154 | A1 | 7/2003 | Babcock et al. |
| 2003/0162370 | A1 | 8/2003 | Sukegawa et al. |
| 2003/0203583 | A1 | 10/2003 | Malik |
| 2004/0123882 | A1 | 7/2004 | Olmer et al. |
| 2004/0188802 | A1 | 9/2004 | Babcock et al. |
| 2004/0256635 | A1 | 12/2004 | Saitoh et al. |

OTHER PUBLICATIONS

Phil Danielson, "Sources of Water Vapor in Vacuum Systems", A Journal of Practical and Useful Vacuum Technology, Sep. 2000, Available at: http://www.vacuumlab.com/Articles/Sources%20of%20Water%20Vapor.pdf (Visited: Jul. 14, 2005).

Sherman Rutherford, "The Benefits of Viton Outgassing", Duniway Stockroom Corp., Feb. 1997, Available at: http://www.duniway.com/images/pdf/pg/viton-out-gassed-orings.pdf (Visited: Jul. 21, 2005).

Viton Gaskets Brochure, Duniway Stockroom Corp. Available at: http://www.duniway.com/images/pdf/pg/p-sp05b-viton-gaskets.pdf (Visited: Jul. 21, 2005).

"Outgassing and Weight Loss Elastomers", Problem Solving Products, Inc., 1997-2005, Available at: http://www.pspglobal.com/outgassing-elastomers.html (Visited: Jul. 14, 2005).

"O-Ring Performance", Kurt J. Lesker Comp., 1996-2004, Available at: http://www.lesker.com/newweb/Vacuum_Components/O_Ring_Seals/O-ring_performance.cfm?CFID=266017&CFTOKEN=49827656 (Visited: Jul. 14, 2005).

Phil Danielson, "The Effects of Humidity on Vacuum Systems", A Journal of Practical and Useful Vacuum Technology, Jun. 2001, Available at: http://www.vacuumlab.com/Articles/VacLab27.pdf (Visited: Jul. 14, 2005).

Robert Lowry, "Sources and Control of Volatile Gases Hazardous to Hermetic Electronic Enclosures", 1999, International Symposium on Advanced Packaging Materials, pp. 94-99.

Darwin Enicks, "A Study of Process-Induced Oxygen Updiffusion in Pseudomorphic Boron-Doped Sub-50 nm SiGeC Layers Grown by LPCVD", Electrochemical and Solid-State Letters, 2005, G286-G289.

Phil Danielson, "Understanding Water Vapor in Vacuum Systems", Microelectronic Manufacturing and Testing, Jul. 1990, 2 pages.

Phil Danielson, "Gas Loads and O-Rings", A Journal of Practical and Useful Vacuum Technology, Aug. 2000, Available at: http://www.vacuumlab.com/Articles/Gas%20Loads%20and%20O-Rings.pdf (Visited: Jul. 14, 2005), 4 pages.

T. Ghani et al., "Effect of Oxygen on Minority-Carrier Lifetime and Recombination Currents in Si(1-x)Ge(x) Heterostructure Devices", Appl. Phys. Lett., vol. 58, Mar. 12, 1991, pp. 1317-1319.

Kunz et al., "Polycrystalline Silicon-Germanium Emitters for Gain Control, With Application to SiGe HBTs", IEEE Transactions on Electron Devices, vol. 50, No. 6, Jun. 2003.

* cited by examiner

METHOD AND SYSTEM FOR CONTROLLED OXYGEN INCORPORATION IN COMPOUND SEMICONDUCTOR FILMS FOR DEVICE PERFORMANCE ENHANCEMENT

CROSS-REFERENCE TO RELATED APPLICATIONS

The present application is related to co-pending U.S. patent application Ser. No. 10/327,321 entitled "Very Low Moisture O-Rings and Method For Preparing the Same" filed on Dec. 20, 2002 and assigned to the assignee of the present application, and U.S. patent application Ser. No. 10/801,435 entitled "System Apparatus and Method for Contamination reduction in Semiconductor device Fabrication Equipment Components" filed on Mar. 15, 2004, and assigned to the assignee of the present application.

The present application is also related to co-pending U.S. patent application Ser. No. 11/267,474 entitled Method and System for Providing A Heterojunction Bipolar Transistor Having SiGe Extensions filed on even date herewith and assigned to the assignee of the present application, and U.S. patent application Ser. No. 11/266,797 entitled Bandgap Engineered Mono-Crystalline Silicon Cap Layers for SiGe HBT Performance Enhancement filed on even date herewith and assigned to the assignee of the present application, and U.S. patent application Ser. No. 11/267,553 entitled Bandgap and Recombination Engineered Emitter Layers for SiGe HBT Performance Optimization filed on even date herewith and assigned to the assignee of the present application.

FIELD OF THE INVENTION

The present invention relates to semiconductor processing and semiconductor devices, and more particularly to a method and system for incorporating oxygen in a controlled manner to heterostructure semiconductive devices such as heterojunction bipolar transistors.

BACKGROUND OF THE INVENTION

FIG. 1 depicts a conventional heterojunction bipolar transistor (HBT) 10 formed on a substrate 11. The conventional HBT 10 includes a conventional collector 12, a conventional compound base 16, and a conventional emitter 20. In some conventional HBTs 10, the conventional collector 12 is separated from the conventional compound base 16 by a conventional spacer layer 14. In addition, a conventional capping layer 18 may be provided between the conventional compound base 16 and the conventional emitter 20.

In a conventional HBT 10, the conventional compound base 16 is typically formed from a compound layer, generally of doped SiGe or SiGeC. The dopant used for the conventional compound base 16 is boron. In addition, the conventional spacer layer 14 and conventional capping layer 18 are typically undoped silicon. The conventional emitter 20 and the conventional collector 12 are typically doped so that the conventional HBT 10 is an NPN or a PNP transistor.

Although the conventional HBT 10 functions, one of ordinary skill in the art will readily recognize that improved performance of the conventional HBT 10 is desirable. For example, as device speeds are increased, current gains become greatly elevated and breakdown voltages are greatly reduced, which is often undesirable. The rate of stored charge dissipation in the compound base, base-emitter, and collector regions is desired to be kept elevated. The steep, repeatable boron profiles for the highest Ft and Fmax are also desired to be maintained in order to ensure that the performance of the conventional HBT 10 is repeatable. Furthermore, one of ordinary skill in the art will readily recognize that the introduction of certain contaminants can adversely affect the performance of the conventional HBT 10. For example, although oxygen may reduce boron out diffusion and reduce the pinched base resistance RSBi, such oxygen diffusion is uncontrolled and thus is typically regarded as an undesirable contaminant in conventional SiGe and SiGeC HBT devices. For example, oxygen contamination is typically a result of leaks, outgassing, and permeation sources in the process reactor. Such, oxygen contaminants have been shown to reduce minority carrier lifetime, which leads to increased base recombination current and reduced current gain. Similarly, oxygen contaminants have been observed to result in increased base resistance of SiGe when boron is incorporated as the dopant for the conventional base 16.

Accordingly, what is needed is a method and system for improving performance of the conventional HBT 10. The present invention addresses such a need.

BRIEF SUMMARY OF THE INVENTION

The present invention provides a method and system for providing a bipolar transistor. The method and system comprise providing a compound base region, providing an emitter region coupled with the compound base region, and providing a collector region coupled with the compound base region. The bipolar transistor may also include at least one other predetermined portion. The method and system also comprise providing at least one predetermined amount of oxygen to at least one of the compound base region, the emitter region, the collector region, and the predetermined portion of the bipolar transistor.

According to the method and system disclosed herein, the present invention allows oxygen to be provided in a controlled manner that allows for improved performance of the bipolar transistor.

DETAILED DESCRIPTION OF THE INVENTION

Figure 1:
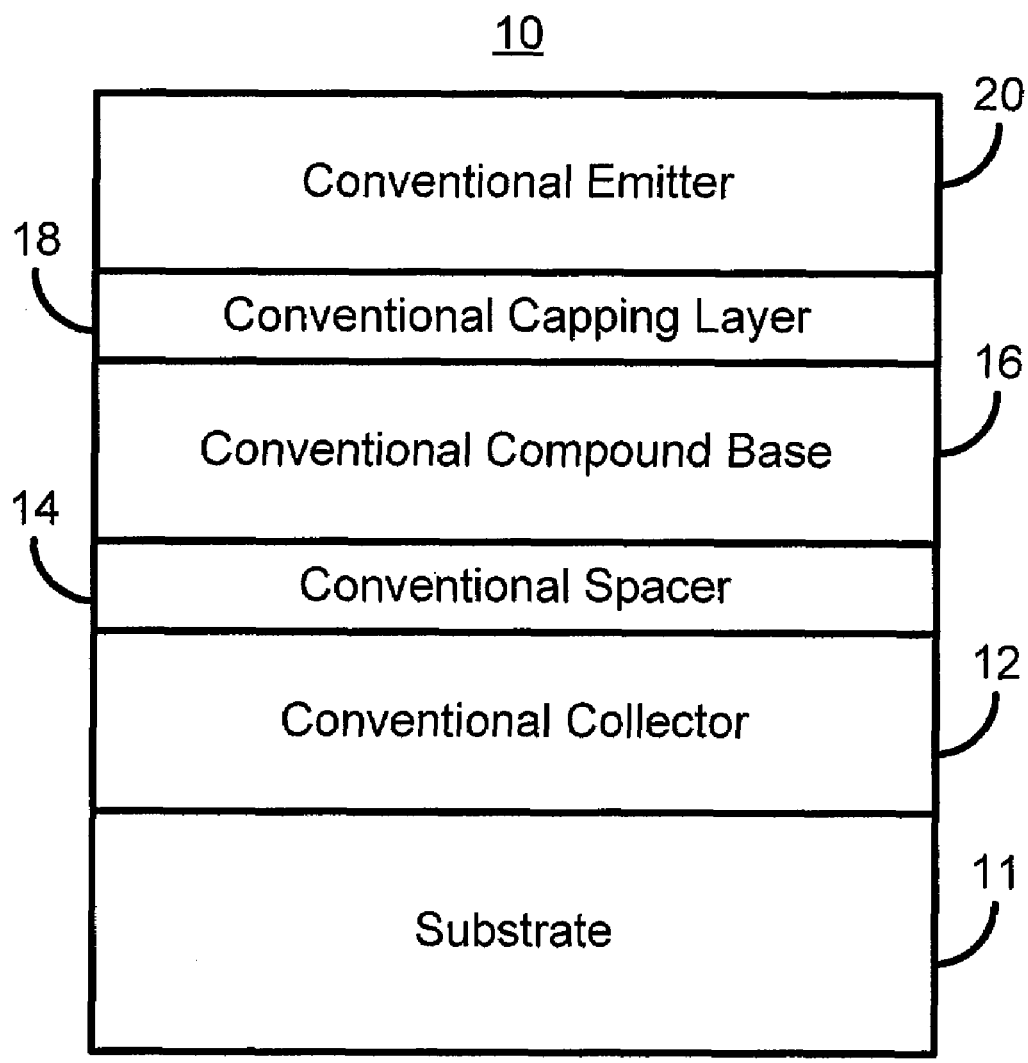
FIG. 1 is a diagram of a conventional heterojunction bipolar transistor device.

The present invention relates to semiconductor devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a bipolar transistor. The method and system comprise providing a compound base region, providing an emitter region coupled with the compound base region, and providing a collector region coupled with the compound base region. The bipolar transistor may also include at least one other predetermined portion. The method and system also comprise providing at least one predetermined amount of oxygen to at least one of the compound base region, the emitter region, the collector region, and the predetermined portion of the bipolar transistor.

The improvement is made possible by providing a method for controlled oxygen incorporation. This is also made possible by implementing oxygen reduction methods described in co-pending patent application Ser. No. 10/327,321 entitled "Very Low Moisture O-Rings and Method For Preparing the Same" filed on Dec. 20, 2002 and assigned to the assignee of the present application, and U.S. patent application Ser. No. 10/801,435 entitled "System Apparatus and Method for Contamination reduction in Semiconductor device Fabrication Equipment Components" filed on Mar. 15, 2004, and assigned to the assignee of the present application. Applicant hereby incorporates by reference the above-identified co-pending patent applications.

The present invention will be described in terms of a particular HBT device. However, one of ordinary skill in the art will readily recognize that the method and system may be applicable to other device(s) having other, additional, and/or different components and/or positions not inconsistent with the present invention. For example, the method and system in accordance with the present invention may be applicable to compound semiconductor devices including but not limited to high electron mobility transistors (HEMTs), FETs, and laser diodes. Similarly, the method and system in accordance with the present invention may be applicable to devices utilizing materials such as GaAs, InP, and AlGaAs. The present invention is also described in the context of particular methods. One of ordinary skill in the art will, however, recognize that the method could have other and/or additional steps. Moreover, although the methods are described in the context of providing a single HBT device, one of ordinary skill in the art will readily recognize that multiple device may be provided in parallel.

Figure 2:
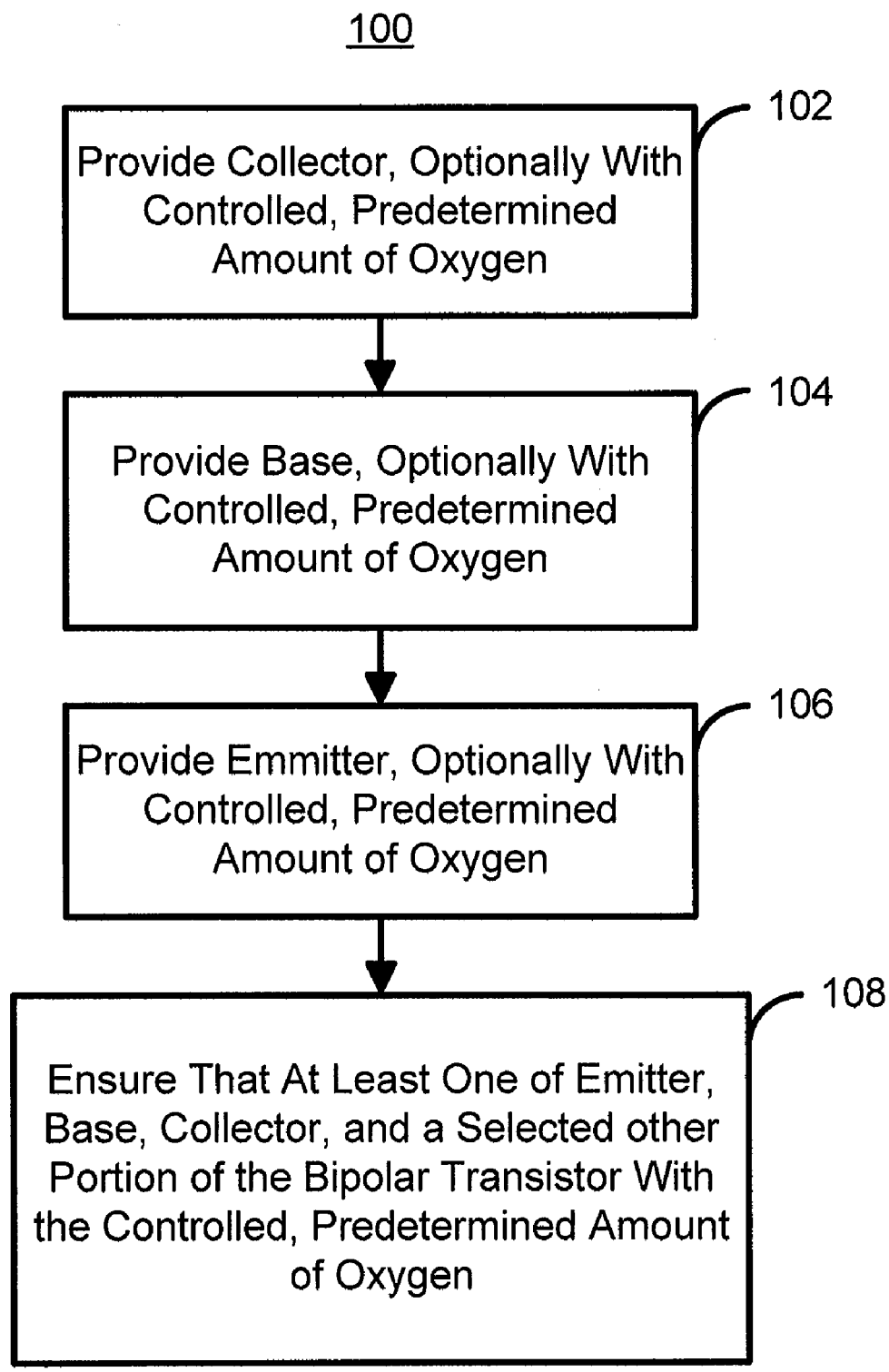
FIG. 2 is a flow chart depicting one embodiment of a method in accordance with the present invention for providing a bipolar transistor device having improved performance.

FIG. 2 is a flow chart depicting one embodiment of a method 100 in accordance with the present invention for providing a bipolar transistor device having improved performance. For simplicity, certain steps have been omitted or merged. A collector is provided, via step 102. In one embodiment, step 102 includes performing an implant of a desired dopant type. The collector formed in step 102 optionally includes a controlled amount of oxygen. The amount of oxygen that may be provided in the collector is predetermined, prior to step 102 being carried out. The base is formed, via step 104. Step 104 preferably includes forming a compound base, for instance the growth of SiGe or SiGeC by LPCVD. For a p-type base region, boron is typically incorporated in-situ with diborane as the source gas. The base formed in step 104 optionally includes a predetermined, controlled amount of oxygen. The emitter is provided, via step 106. Step 106 includes performing an implant or an in-situ doping during LPCVD of a desired amount of dopant. The emitter formed in step 106 optionally includes a predetermined, controlled amount of oxygen. It is ensured that at least one of the base region, the emitter region, the collector region, and another predetermined portion of the bipolar transistor, such as a spacer or capping layer, is provided with a predetermined amount of oxygen in a controlled manner, via step 108.

Thus, a predetermined amount of oxygen is provided to the base region, emitter region, collector region and/or another region of the HBT device in a controlled manner in steps 102, 104, 106, and/or 108. For example, oxygen may be provided in the entire SiGe (or SiGeC) layer. Alternatively, the oxygen may be provided at specific portions of the device. Providing the oxygen may include implanting oxygen in the desired portion(s) of the device, providing the oxygen through chemical vapor deposition (CVD) or some combination of thereof. In another embodiment, the oxygen is updiffused into the desired portion of the device. For example, in one embodiment, the predetermined amount of oxygen provided to the SiGe (or SiGeC) layer forming the base region. In order to do so, the collector is provided with oxygen using an implant or CVD as described above. A thermal treatment, for example in step 108, is provided to allow the oxygen to updiffuse from the collector region into the strained SiGe or SiGeC layer. In such an embodiment, the amount of oxygen that updiffuses is directly proportional to the total doses of boron and carbon present. Also in this embodiment, such an amount of oxygen that updiffuses is also inversely proportional to the total doses of boron and carbon. The updiffusion of oxygen is self limiting and, therefore, accurate and repeatable. Consequently, the amount of oxygen can be considered to be predetermined in that determined from the factors described above. Moreover, in such an embodiment, the position of the oxygen after updiffusion is within the SiGe or SiGeC layer and self-aligned to the regions of the SiGe or SiGeC layer and to previous locations of C and B in various Ge profiles. Moreover, the self-aligned nature of the oxygen updiffusion allows for minority carrier lifetime engineering of specific regions of interest within the SiGe or SiGeC layer of the base region. In alternate embodiments, individual regions may be implanted with oxygen or provided with oxygen via CVD. In other embodiments, a combination of implanting and/or CVD of individual regions and oxygen updiffusion may be used.

Thus, using the method 100, a controlled amount of oxygen may be provided to particular regions of the HBT device. Introduction of the predetermined amounts of oxygen may increase carrier recombination rates, thereby increasing base recombination current and reduced current gain. As a result, the breakdown voltage may be increased. In addition, charge dissipation may increase for improved Ft/Fmax values. The introduction of the controlled amount of oxygen also reduces boron out diffusion. Consequently, boron profiles may be steeper, allowing for a narrower base region and improved Ft/Fmax values. Device performance may, therefore, be improved.

Figure 3:
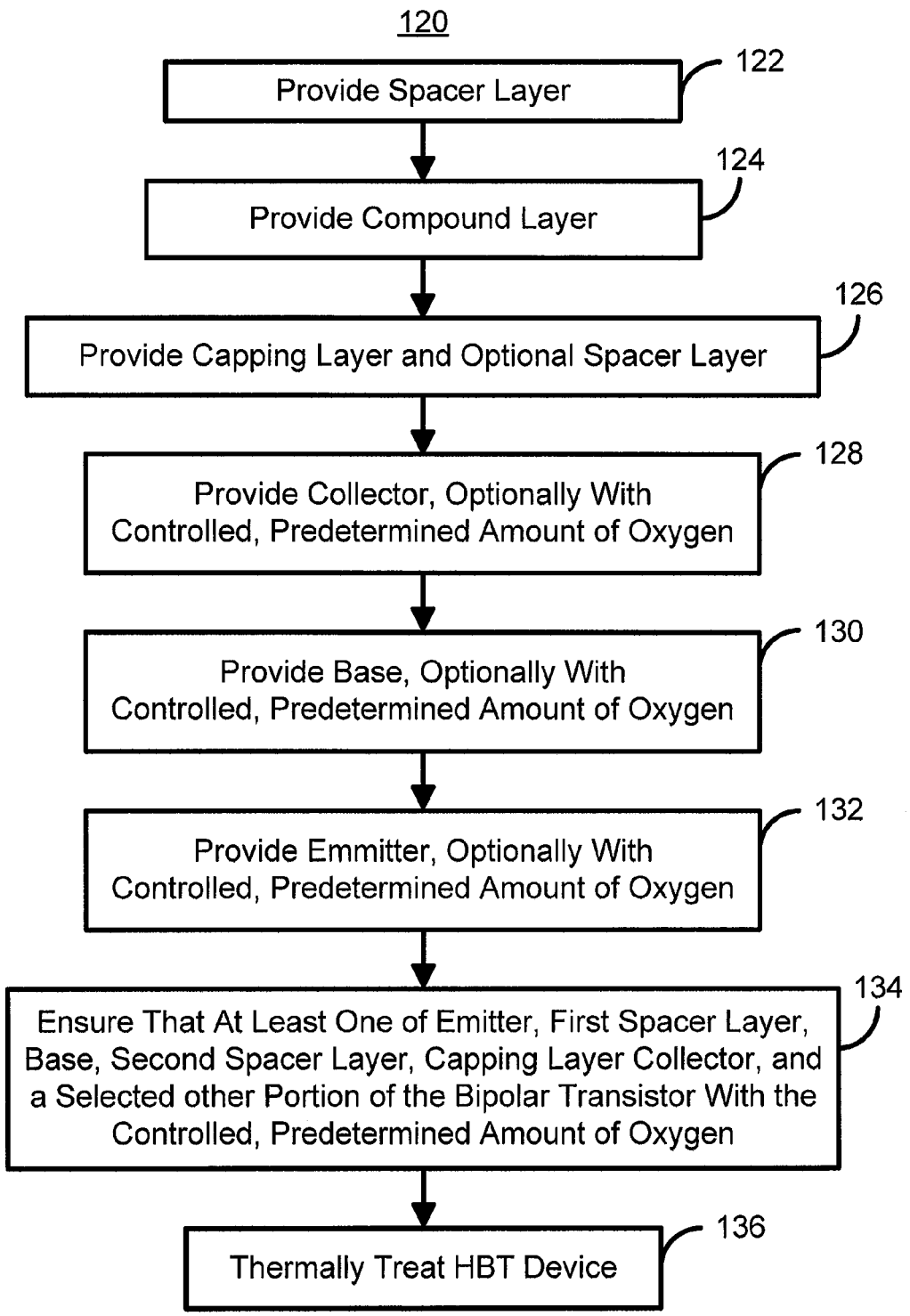
FIG. 3 is a flow chart depicting another embodiment of a method in accordance with the present invention for providing a heterojunction bipolar transistor device having improved performance.

FIG. 3 is a flow chart depicting another embodiment of a method 120 in accordance with the present invention for providing a heterojunction bipolar transistor device having improved performance. For simplicity, certain steps have been omitted or merged. The silicon spacer layer is formed on an underlying substrate, via step 122. The SiGe or SiGeC layer is formed on the spacer layer, via step 124. Step 124 thus includes incorporating Ge and, optionally, C, generally by CVD. The silicon cap layer is also provided on the SiGe or SiGeC layer, via step 126. Step 126 could also include providing a spacer layer on the SiGe or SiGeC layer, but below the capping layer. The collector is provided, via step 128. In one embodiment, the collector resides below the silicon spacer layer. In one embodiment, step 128 includes providing a phosphorus dopant. In another embodiment, another dopant may be used. The compound base is provided, via step 130.

Step 130 includes implanting the SiGe or SiGeC layer with the desired dopant, such as B. The emitter is provided, via step 132. In one embodiment, the emitter resides on the silicon cap layer. Step 132 includes providing a dopant of the desired type. For example, in one embodiment, step 132 includes providing a phosphorus dopant. It is ensured that the desired portion(s) of the HBT device are provided with a predetermined amount of oxygen in a controlled manner, via step 134. In one embodiment, step 134 includes performing an oxygen implant or providing the oxygen in-situ during CVD. The oxygen source gas for an LPCVD is generally heliox. However, pure oxygen may also be used for CVD or implant. In one embodiment, the oxygen may be provided in the appropriate position for updiffusion. The HBT device may be thermally treated, via step 136. Thus, step 136 may allow updiffusion to take place to ensure that the predetermined amount of oxygen reaches the desired portion of the HBT device.

Thus, using the method 120, a controlled amount of oxygen may be provided to desired regions of the HBT device. Consequently, the method 120 can be used to provide HBT devices having substantially the same benefits as the method 100.

Figure 4:
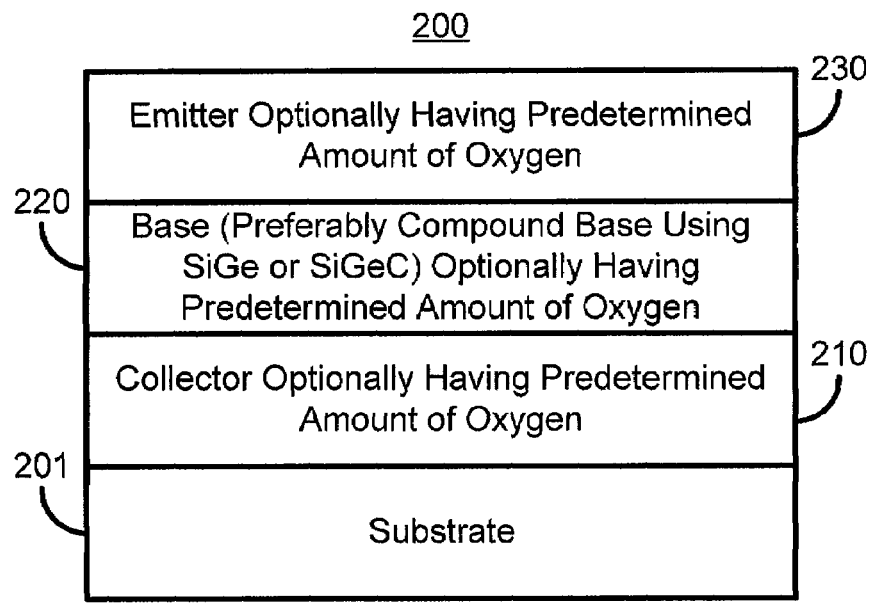
FIG. 4 is a block diagram depicting one embodiment of a bipolar transistor device in accordance with the present invention having improved performance.

FIG. 4 is a block diagram depicting one embodiment of an HBT device 200 in accordance with the present invention having improved performance. The HBT device 200 is formed on a substrate 201 and includes a collector region 210, a compound base region 220, and an emitter region 230. One or more of the collector region 210, the compound base region 220, and the emitter region 230 may include a predetermined amount of oxygen. Thus, the HBT device 200 may be provided using the method 100 or 120. The base region 220 is formed from a SiGe or SiGeC layer. Any combination of the collector region 210, the compound base region 220, and the emitter region 230 may have a predetermined amount of oxygen provided in a controlled manner. In addition, the amount of oxygen in each of the collector region 210, the compound base region 220, and the emitter region 230 may differ.

Because regions 210, 220, and/or 230 may include predetermined amounts of oxygen, the carrier recombination rates may be increased for the HBT device 200. Thus, the base recombination current may be increased and the current gain reduced. As a result, the breakdown voltage may be increased for the HBT device 200. In addition, charge dissipation may increase, allowing for improved Ft/Fmax values of the HBT device 200. The introduction of the controlled amount of oxygen may also reduce boron out diffusion from the compound base region 220. Consequently, boron profiles may be steeper, allowing for a narrower base region and improved Ft/Fmax values for the HBT device 200. Performance of the HBT device 200 may, therefore, be improved.

Figure 5:
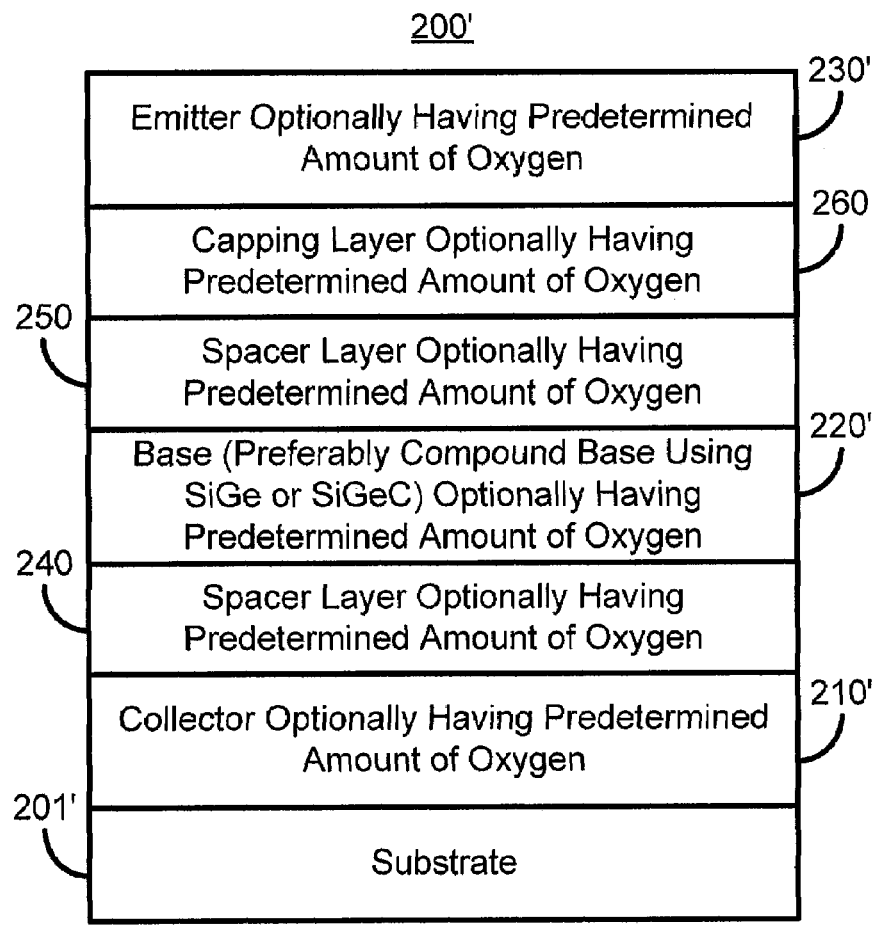
FIG. 5 is a block diagram depicting another embodiment of a bipolar transistor device in accordance with the present invention having improved performance.

FIG. 5 is a block diagram depicting another embodiment of an HBT device 200' in accordance with the present invention having improved performance. Portions of the HBT device 200' are analogous to the HBT device 200 and are, therefore, labeled similarly. The HBT device 200' thus is formed on a substrate 201' and includes a collector region 210', a base region 220' formed from SiGe or SiGeC, and an emitter region 230'. The HBT device 200' also includes a first spacer layer 240 between the collector region 210' and the compound base region 220', a second spacer layer 250 and a capping layer 260 between the compound base region 220' and the emitter region 230'. In the HBT device 200', any combination of the collector region 210', the first spacer layer 240, the compound base region 220', the second spacer layer 250, the capping layer 260, and the emitter region 230' may include a predetermined amount of oxygen provided in a controlled manner.

Because regions 210', 220', 230', 240, 250, and/or 260 may include predetermined amounts of oxygen, the carrier recombination rates may be increased for the HBT device 200'. Thus, the base recombination current may be increased and the current gain reduced. As a result, the breakdown voltage may be increased for the HBT device 200'. In addition, charge dissipation may increase, allowing for improved Ft/Fmax values of the HBT device 200'. The introduction of the controlled amount of oxygen may also reduce boron out diffusion from the compound base region 220'. Consequently, boron profiles may be steeper, allowing for a narrower compound base region and improved Ft/Fmax values for the HBT device 200'. Performance of the HBT device 200' may, therefore, be improved.

A method and system for providing a bipolar transistor has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. A heterostructure semiconductor device comprising:
   a compound semiconductive layer including at least two materials selected from silicon, germanium, carbon, gallium, indium, aluminum, arsenic, and phosphorus, a first region having first doping type formed using the compound semiconductive layer;
   at least one additional semiconductive region having a second doping type opposite of the first doping type; and
   at least one of the first semiconductive region and the additional semiconductive region including at least one predetermined amount of oxygen.

2. The heterostructure semiconductor device of claim 1 wherein the heterostructure semiconductor device includes at least one of a heterojunction bipolar transistor, a high electron mobility transistor, a field-effect transistor, and a laser diode.

3. A bipolar transistor comprising:
   a compound semiconductive base region;
   an emitter semiconductive region coupled with the compound semiconductive base region; and
   a collector semiconductive region coupled with the compound semiconductive base region;
   at least one of the compound base semiconductive region, the emitter semiconductive region, the collector semiconductive region, and a predetermined portion of the bipolar transistor including at least one predetermined amount of oxygen.

4. The bipolar transistor of claim 3 further comprising:
   at least one spacer residing between the compound base region and the collector region, the predetermined portion including the at least one spacer.

5. The bipolar transistor of claim 3 further comprising:
   at least one spacer residing between the compound base and the emitter, the predetermined portion including the at least one spacer.

6. The bipolar transistor of claim 3 further comprising:
   at least one silicon seed layer, the predetermined portion including the at least one silicon seed layer.

7. The bipolar transistor of claim 6 wherein the at least one silicon seed layer is undoped.

8. The bipolar transistor of claim 6 wherein the collector region includes a first predetermined amount of oxygen and the at least one silicon seed layer includes a second predetermined amount of oxygen.

9. The bipolar transistor of claim 3 further comprising:
at least one capping layer between the emitter region and the compound base region, the predetermined portion including the at least one capping layer.

10. The bipolar transistor of claim 9 wherein the emitter region includes a first predetermined amount of oxygen and the at least one capping layer includes a second predetermined amount of oxygen.

11. The bipolar transistor of claim 3 wherein the predetermined amount is provided in-situ oxygen incorporation during CVD growth.

12. The bipolar transistor of claim 3 wherein the compound base region includes SiGe or SiGeC.

13. A bipolar transistor comprising:
a silicon seed layer;
a compound base semiconductive region including at least one of SiGe and SiGeC and formed on the silicon seed layer;
a first spacer;
an emitter semiconductive region coupled with the compound base semiconductive region and formed on the silicon seed layer, the first spacer between the compound base semiconductive region and the emitter semiconductive region;
a collector semiconductive region coupled with the compound base semiconductive region and formed on the silicon seed layer;
a second spacer between the compound base semiconductive region and the collector semiconductive region; and
a capping layer residing between the first spacer and the emitter semiconductive region;
at least one of the compound base semiconductive region, the emitter semiconductive region, the collector semiconductive region, the silicon seed layer, the first spacer, the second spacer, and the capping layer including at least one predetermined amount of oxygen.

14. A semiconductor device comprising:
at least one bipolar transistor, each of the at least one bipolar transistor including a compound base semiconductive region, an emitter semiconductive region coupled with the compound base semiconductive region, and a collector semiconductive region coupled with the compound base semiconductive region;
wherein at least one of the compound base semiconductive region, the emitter semiconductive region, the collector semiconductive region, and a predetermined portion of the bipolar transistor includes at least one predetermined amount of oxygen.

15. A bipolar transistor comprising:
a compound base region;
an emitter region coupled with the compound base region;
a collector region coupled with the compound base region;
at least one of the compound base region, the emitter region, the collector region, and a predetermined portion of the bipolar transistor including at least one predetermined amount of oxygen; and
at least one silicon seed layer, the predetermined portion including the at least one silicon seed layer.

16. A bipolar transistor comprising:
a compound base region;
an emitter region coupled with the compound base region;
a collector region coupled with the compound base region;
at least one of the compound base region, the emitter region, the collector region, and a predetermined portion of the bipolar transistor including at least one predetermined amount of oxygen; and
at least one undoped silicon seed layer, the predetermined portion including the at least one undoped silicon seed layer.

17. A bipolar transistor comprising:
a compound base region;
an emitter region coupled with the compound base region;
a collector region coupled with the compound base region;
at least one of the compound base region, the emitter region, the collector region, and a predetermined portion of the bipolar transistor including at least one predetermined amount of oxygen and wherein the collector region includes a first predetermined amount of oxygen and the at least one silicon seed layer includes a second predetermined amount of oxygen.

18. A bipolar transistor comprising:
a compound base region;
an emitter region coupled with the compound base region;
a collector region coupled with the compound base region;
at least one of the compound base region, the emitter region, the collector region, and a predetermined portion of the bipolar transistor including at least one predetermined amount of oxygen; and
at least one capping layer between the emitter region and the compound base region, the predetermined portion including the at least one capping layer and wherein the emitter region includes a first predetermined amount of oxygen and the at least one capping layer includes a second predetermined amount of oxygen.

* * * * *

UNITED STATES PATENT AND TRADEMARK OFFICE
CERTIFICATE OF CORRECTION

PATENT NO. : 7,439,558 B2 Page 1 of 1
APPLICATION NO. : 11/267473
DATED : October 21, 2008
INVENTOR(S) : Enicks It is certified that error appears in the above-identified patent and that said Letters Patent is hereby corrected as shown below:

On Page 2, under "Other Publications", in column 2, line 11, after "Loss" insert -- of --.

Signed and Sealed this

Thirteenth Day of January, 2009

JON W. DUDAS
*Director of the United States Patent and Trademark Office*